(12) United States Patent
Gu et al.

(10) Patent No.: US 10,643,729 B2
(45) Date of Patent: May 5, 2020

(54) SHIFT REGISTER AND METHOD OF DRIVING THE SAME, GATE DRIVING CIRCUIT, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Honggang Gu, Beijing (CN); Xianjie Shao, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 16/144,707

(22) Filed: Sep. 27, 2018

(65) Prior Publication Data
US 2019/0096500 A1 Mar. 28, 2019

(30) Foreign Application Priority Data
Sep. 28, 2017 (CN) .......................... 2017 1 0897511

(51) Int. Cl.
*G11C 19/28* (2006.01)
*G09G 3/20* (2006.01)

(52) U.S. Cl.
CPC ............ *G11C 19/287* (2013.01); *G09G 3/20* (2013.01); *G11C 19/28* (2013.01); *G09G 2300/0426* (2013.01); *G09G 2300/0819* (2013.01); *G09G 2310/0286* (2013.01); *G09G 2310/08* (2013.01)

(58) Field of Classification Search
CPC ... G09G 2310/0286; G09G 2310/0284; G09G 3/20; G09G 2300/0426; G09G 2300/0819; G09G 2310/08; G09G 3/3674; G09G 3/3677; G11C 19/287; G11C 19/28
See application file for complete search history.

(56) References Cited

U.S. PATENT DOCUMENTS

| 10,249,243 B2 * | 4/2019 | Li ........................ G09G 3/3258 |
| 2012/0262440 A1 * | 10/2012 | Zhao .................... G09G 3/3677 345/212 |
| 2014/0009375 A1 * | 1/2014 | Tsai ........................ G09G 3/36 345/98 |

(Continued)

*Primary Examiner* — Ibrahim A Khan
(74) *Attorney, Agent, or Firm* — McDermott Will & Emery LLP

(57) ABSTRACT

A shift register includes a pull-up node, a pull-down node and a compensation sub-circuit. The pull-up node is configured to control a signal output terminal of the shift register to output a gate scanning signal, and the pull-down node is configured to stop the signal output terminal of the shift register from outputting the gate scanning signal. The compensation sub-circuit is connected to the pull-up node and/or the pull-down node, a compensation signal terminal, and a common voltage terminal. The compensation sub-circuit is configured to output a voltage from the compensation signal terminal to an output terminal of the compensation sub-circuit under the control of a signal from the pull-up node and/or a signal from the pull-down node. The output terminal of the compensation sub-circuit is connected to the common voltage terminal.

13 Claims, 9 Drawing Sheets

(56) References Cited

U.S. PATENT DOCUMENTS

| | | | |
|---|---|---|---|
| 2015/0185520 A1* | 7/2015 | Xu | G02F 1/13306 349/38 |
| 2016/0042691 A1* | 2/2016 | Na | G09G 3/3266 345/205 |
| 2016/0049136 A1* | 2/2016 | Seo | G09G 3/3611 345/213 |
| 2016/0180787 A1* | 6/2016 | Park | G09G 3/20 345/212 |
| 2016/0240158 A1* | 8/2016 | Xu | G11C 19/28 |
| 2016/0247476 A1* | 8/2016 | Xiao | G09G 3/3677 |
| 2017/0185194 A1* | 6/2017 | Kim | G06F 3/0412 |
| 2017/0185195 A1* | 6/2017 | Kim | G06F 3/0412 |

* cited by examiner

SHIFT REGISTER AND METHOD OF DRIVING THE SAME, GATE DRIVING CIRCUIT, AND DISPLAY DEVICE

CROSS-REFERENCE TO RELATED APPLICATION

This application claims priority to Chinese Patent Application No. 201710897511.1, filed on Sep. 28, 2017, titled "SHIFT REGISTER UNIT AND METHOD OF DRIVING THE SAME, GATE DRIVING CIRCUIT, AND DISPLAY DEVICE", which is incorporated herein by reference in its entirety.

TECHNICAL FIELD

The present disclosure relates to the field of display technologies, and in particular, to a shift register and a method of driving the same, a gate driving circuit, and a display device.

BACKGROUND

With the continuous improvement of display technologies, people are setting higher requirements for display devices, and features such as large size, high resolution, and narrow bezel are attracting more and more attention.

SUMMARY

In an aspect, a shift register is provided, and the shift register includes a pull-up node, a pull-down node, and a compensation sub-circuit. The pull-up node is configured to control a signal output terminal of the shift register to output a gate scanning signal, and the pull-down node is configured to stop the signal output terminal of the shift register from outputting the gate scanning signal. The compensation sub-circuit is connected to the pull-up node and/or the pull-down node, a compensation signal terminal, and a common voltage terminal. The compensation sub-circuit is configured to output a voltage from the compensation signal terminal to an output terminal of the compensation sub-circuit under the control of a signal from the pull-up node and/or a signal from the pull-down node. The output terminal of the compensation sub-circuit is connected to the common voltage terminal.

In some embodiments, the shift register further includes a compensation control sub-circuit connected to a compensation control terminal. The compensation control sub-circuit is further connected between the output terminal of the compensation sub-circuit and the common voltage terminal, and the compensation control sub-circuit is configured to output a voltage from the output terminal of the compensation sub-circuit to the common voltage terminal under the control of a signal from the compensation control terminal.

In some embodiments, the compensation sub-circuit includes a first transistor. A gate electrode of the first transistor is connected to the pull-down node or the pull-up node, a first electrode of the first transistor is connected to the compensation signal terminal, and a second electrode of the first transistor is connected to the common voltage terminal as the output terminal of the compensation sub-circuit.

In some embodiments, the compensation sub-circuit includes a first transistor and a second transistor. A gate electrode of the first transistor is connected to the pull-down node, a first electrode of the first transistor is connected to the compensation signal terminal, and a second electrode of the first transistor is connected to the common voltage terminal as the output terminal of the compensation sub-circuit. A gate electrode of the second transistor is connected to the pull-up node, a first electrode of the second transistor is connected to the compensation signal terminal, and a second electrode of the second transistor is connected to the common voltage terminal as the output terminal of the compensation sub-circuit.

In some embodiments, the compensation control sub-circuit includes a third transistor. A gate electrode of the third transistor is connected to the compensation control terminal, a first electrode of the third transistor is connected to the output terminal of the compensation sub-circuit, and a second electrode of the third transistor is connected to the common voltage terminal.

In some embodiments, the shift register further includes an output sub-circuit, a pull-down sub-circuit, a pull-up control sub-circuit, a reset sub-circuit, a first pull-down control sub-circuit, a second pull-down control sub-circuit, and an energy storage sub-circuit. The output sub-circuit is connected to a clock signal terminal, the pull-up node, and the signal output terminal, and the output sub-circuit is configured to output a voltage from the clock signal terminal to the signal output terminal under the control of a signal from the pull-up node. The pull-down sub-circuit is connected to the pull-down node, a first voltage terminal, and the signal output terminal, and the pull-down sub-circuit is configured to output a voltage from the first voltage terminal to the signal output terminal under the control of a signal from the pull-down node. The pull-up control sub-circuit is connected to the pull-up node, a signal input terminal, and a second voltage terminal, and the pull-up control sub-circuit is configured to output a voltage from the second voltage terminal to the pull-up node under the control of a signal from the signal input terminal. The reset sub-circuit is connected to a reset signal terminal, a third voltage terminal, and the pull-up node, and the reset sub-circuit is configured to output a voltage from the third voltage terminal to the pull-up node under the control of a signal from the reset signal terminal. The first pull-down control sub-circuit is connected to the first voltage terminal, the pull-up node, and the pull-down node, and the first pull-down control sub-circuit is configured to output a voltage from the first voltage terminal to the pull-down node under the control of a signal from the pull-up node. The second pull-down control sub-circuit is connected to the first voltage terminal, a fourth voltage terminal, the pull-up node, and the pull-down node, and the second pull-down control sub-circuit is configured to output a voltage from the fourth voltage terminal to the pull-down node under the control of a signal from the fourth voltage terminal; or, the second pull-down control sub-circuit is configured to receive a signal from the first voltage terminal and stop outputting the voltage from the fourth voltage terminal to the pull-down node under the control of the pull-up node. The energy storage sub-circuit is connected between the pull-up node and the signal output terminal, and the energy storage sub-circuit is configured to store a voltage of the pull-up node or to charge the pull-up node.

In some embodiments, the shift register further comprises a first noise-removal sub-circuit, and/or a second noise-removal sub-circuit. The first noise-removal sub-circuit is connected to the first voltage terminal, the pull-up node, and the pull-down node, and the first noise-removal sub-circuit is configured to output a voltage from the first voltage terminal to the pull-up node under the control of a signal from the pull-down node. The second noise-removal sub-circuit is connected to an initial signal terminal, the first voltage terminal, and the pull-up node, and the second noise-removal sub-circuit is configured to output a voltage from the first voltage terminal to the pull-up node under the control of a signal from the initial signal terminal.

In some embodiments, the output sub-circuit comprises a fourth transistor; a gate electrode of the fourth transistor is connected to the pull-up node, a first electrode of the fourth transistor is connected to the clock signal terminal, and a second electrode of the fourth transistor is connected to the signal output terminal. The pull-down sub-circuit comprises a fifth transistor; a gate electrode of the fifth transistor is connected to the pull-down node, a first electrode of the fifth transistor is connected to the first voltage terminal, and a second electrode of the fifth transistor is connected to the signal output terminal. The pull-up control sub-circuit comprises a sixth transistor; a gate electrode of the sixth transistor is connected to the signal input terminal, a first electrode of the sixth transistor is connected to the second voltage terminal, and a second electrode of the sixth transistor is connected to the pull-up node. The reset sub-circuit comprises a seventh transistor; a gate electrode of the seventh transistor is connected to the reset signal terminal, a first electrode of the seventh transistor is connected to the third voltage terminal, and a second electrode of the seventh transistor is connected to the pull-up node. The first pull-down control sub-circuit comprises an eighth transistor; a gate electrode of the eighth transistor is connected to the pull-up node, a first electrode of the eighth transistor is connected to the first voltage terminal, and a second electrode of the eighth transistor is connected to the pull-down node. The second pull-down control sub-circuit comprises a ninth transistor, a tenth transistor, and an eleventh transistor. A gate electrode of the ninth transistor is connected to the pull-up node, a first electrode of the ninth transistor is connected to the first voltage terminal, and a second electrode of the ninth transistor is connected to a gate electrode of the eleventh transistor. A gate electrode and a first electrode of the tenth transistor are connected to the fourth voltage terminal, and a second electrode of the tenth transistor is connected to the gate electrode of the eleventh transistor. A first electrode of the eleventh transistor is connected to the fourth voltage terminal, and a second electrode of the eleventh transistor is connected to the pull-down node. The energy storage sub-circuit comprises a first capacitor; one end of the first capacitor is connected to the pull-up node, and an opposite end of the first capacitor is connected to the signal output terminal.

In some embodiments, the first noise-removal sub-circuit comprises a twelfth transistor. A gate electrode of the twelfth transistor is connected to the pull-down node, a first electrode of the twelfth transistor is connected to the first voltage terminal, and a second electrode of the twelfth transistor is connected to the pull-up node. The second noise-removal sub-circuit comprises a thirteenth transistor. A gate electrode of the thirteenth transistor is connected to the initial signal terminal, a first electrode of the thirteenth transistor is connected to the first voltage terminal, and a second electrode of the thirteenth transistor is connected to the pull-up node.

In another aspect, a gate driving circuit is provided, and the gate driving circuit includes at least two shift registers described in the above aspect connected in cascade. A signal input terminal of a first-stage shift register is connected to a start signal terminal. Except for the first-stage shift register, a signal output terminal of a shift register in a previous stage is connected to a signal input terminal of a shift register in a next stage. Except for a last-stage shift register, a signal output terminal of a shift register in a next stage is connected to a reset signal terminal of a shift register in a previous stage. A reset signal terminal of the last-stage shift register is connected to the start signal terminal.

In yet another aspect, a display device is provided, and the display device includes at least one common electrode and the gate driving circuit described above. And at least one of common voltage terminals of the gate driving circuit is connected to at least one of the at least one common electrode.

In yet another aspect, a method of driving the shift register described in the above aspect is provided. In an image frame, the method includes: in a first phase, outputting, by the pull-up control sub-circuit, a voltage from the second voltage terminal to the pull-up node under a control of a signal from the input signal terminal, and storing the voltage from the second voltage terminal to the energy storage sub-circuit; in a second phase, outputting, by the energy storage sub-circuit, the voltage stored in the first phase to the pull-up node, controlling, by the pull-up node, the output sub-circuit to be turned on, and outputting, by the output sub-circuit, a voltage from the clock signal terminal to the signal output terminal; in a third phase, outputting, by the reset sub-circuit, a voltage from the third voltage terminal to the pull-up node under the control of a signal from the reset signal terminal; outputting, by the second pull-down control sub-circuit, a voltage from the fourth voltage terminal to the pull-down node under the control of a signal from the fourth voltage terminal, controlling, by the pull-down node, the pull-down sub-circuit to be turned on, and outputting, by the pull-down sub-circuit, a voltage from the first voltage terminal to the signal output terminal; in a fourth stage, controlling, by the pull-down node, the pull-down sub-circuit to maintain in a turned-on state, and outputting, by the pull-down sub-circuit, a voltage from the first voltage terminal to the signal output terminal; and repeating the fourth phase before a start of a next image frame to make a voltage from the first voltage terminal to be constantly output via the signal output terminal. In a case where the compensation sub-circuit is connected to the pull-up node, in the first phase and the second phase, the compensation sub-circuit is turned on under the control of a signal from the pull-up node, and outputs a voltage from the compensation signal terminal to an output terminal of the compensation sub-circuit. In a case where the compensation sub-circuit is connected to the pull-down node, from the third phase to the start of the next image frame, the compensation sub-circuit is turned on under the control of a signal from the pull-down node, and outputs a voltage from the compensation signal terminal to an output terminal of the compensation sub-circuit.

In some embodiments, in a case where the shift register comprises a compensation control sub-circuit, the method further comprises: determining whether a voltage of the common voltage terminal needs to be compensated; and outputting, by the compensation control sub-circuit, a voltage from the output terminal of the compensation sub-circuit to the common voltage terminal if compensation is required.

BRIEF DESCRIPTION OF THE DRAWINGS

In order to describe technical solutions in some embodiments of the present invention more clearly, the accompanying drawings to be used in the description of embodiments will be introduced briefly. Obviously, the accompanying drawings to be described below are merely some embodiments of the present invention, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

For display devices with a large size, high resolution and narrow bezel, the supply load of a common electrode in such display devices is higher than that in common display devices, and the distances between different positions on the common electrode and the voltage source for supplying the voltage are not the same. In turn, the voltages applied to different positions on the common electrode are different, thereby affecting the display effect of the display devices. For example, for a normal display product, the display screen may appear greenish; or, for a touch and display driver integration (TDDI) product, there may be horizontal lines corresponding to the touch pattern on the display screen.

Figure 1:
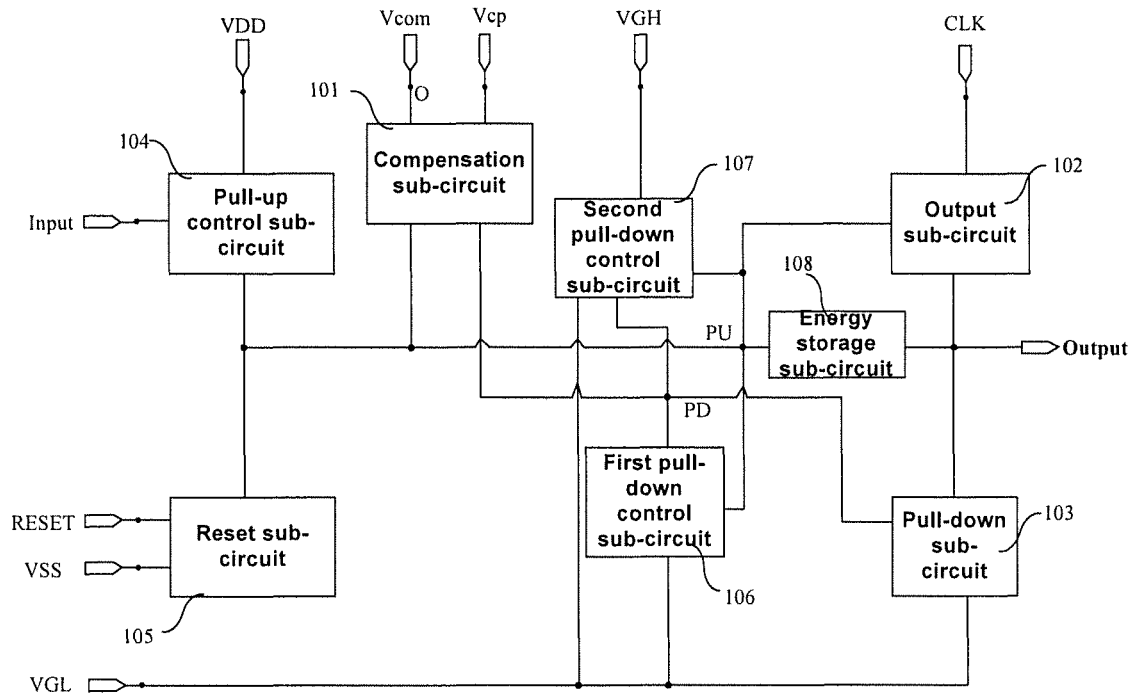
FIG. 1 is a schematic diagram showing a structure of a shift register according to some embodiments of the present disclosure.

In order to solve the above problems, some embodiments of the present disclosure provide a shift register. As shown in FIG. 1, the shift register includes a pull-up node PU and a pull-down node PD. The pull-up node PU is configured to control a signal output terminal Output of the shift register to output a gate scanning signal, and the pull-down node PD is configured to stop the signal output terminal Output of the shift register from outputting the gate scanning signal.

As shown in FIG. 1, the shift register further includes a compensation sub-circuit 101. The compensation sub-circuit 101 is connected to the pull-up node PU and/or the pull-down node PD, and a compensation signal terminal Vcp. The compensation sub-circuit 101 is configured to output a voltage from the compensation signal terminal Vcp (i.e., a compensation voltage) to an output terminal O of the compensation sub-circuit under the control of a signal from the pull-up node and/or the pull-down node. The output terminal O of the compensation sub-circuit is connected to a common voltage terminal Vcom. In the shift register, the pull-up node PU is connected to an output sub-circuit 102. The output sub-circuit 102 is turned on through the pull-up node PU, so as to output a gate scanning signal (for example, a high level signal) through the signal output terminal Output.

The pull-down node PD is connected to a pull-down sub-circuit 103. The pull-down sub-circuit 103 is turned on through the pull-down node PD, so as to output a termination signal (for example, a low level signal) through the signal output terminal Output.

Moreover, in a display device, the common voltage terminal Vcom is generally electrically connected to a common electrode line of the display device, and the common electrode line is electrically connected to a common electrode. In this case, the compensation voltage of the compensation signal terminal Vcp output to the output terminal O of the compensation sub-circuit 101 is transmitted to a common electrode corresponding to the output terminal O through the common electrode line, so as to compensate a common voltage of the common electrode.

It will be noted that the common electrode corresponding to the output terminal O of the compensation sub-circuit 101 refers to a common electrode located at a position of a row of sub-pixels controlled by a gate line connected to the signal output terminal Output of the shift register where the compensation sub-circuit 101 is located.

Figure 11:
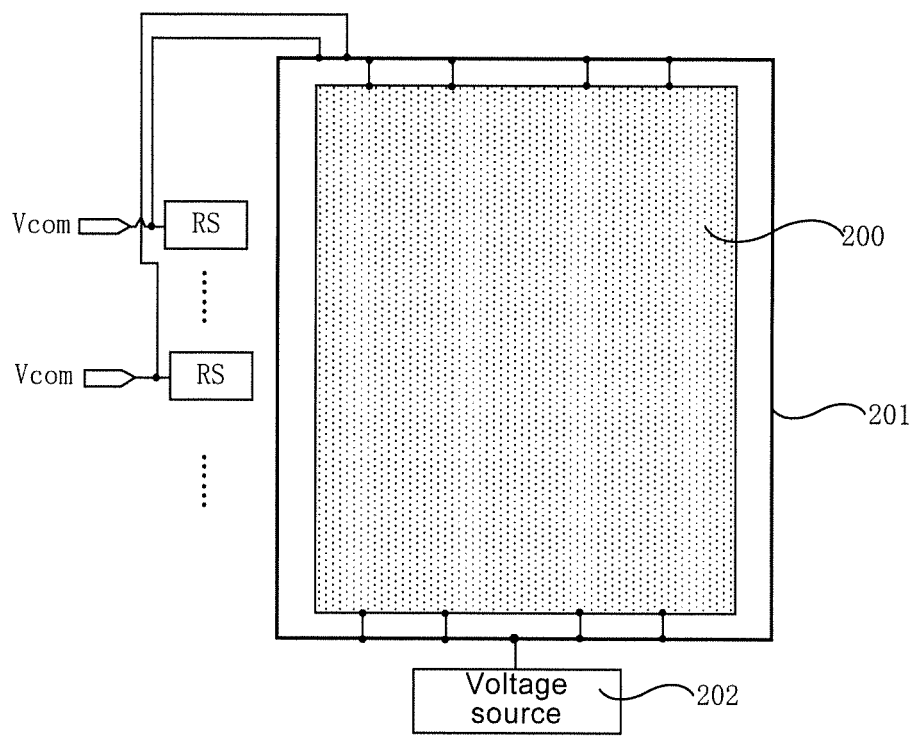
FIG. 11 is a schematic diagram of an arrangement manner of a common electrode according to some embodiments of the present disclosure.
Figure 12A:
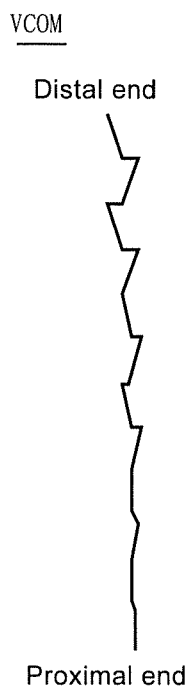
FIG. 12a is a variation curve of common voltages from a distal end to a proximal end when a common electrode is not compensated according to some embodiments of the present disclosure.

Based on this, in some embodiments, the common electrodes at the locations of all sub-pixels are the same common electrode. For example, the display panel has a planar common electrode 200 as shown in FIG. 11. Moreover, a circle of common electrode lines 201 and a voltage source 202 for supplying a common voltage to the common electrode 200 through the common electrode lines 201 are provided on the periphery of the common electrode 200. In this case, a common voltage received by a common electrode line 201 close to the voltage source 202 (at a lower end, that is, the common electrode line 201 at a proximal end) is relatively stable, and a common voltage received by a common electrode line 201 away from the voltage source 202 (at an upper end, that is, the common electrode line 201 at a distal end) differs greatly from a voltage provided by the voltage source 202, and is thus subjected to a larger pull. As shown in FIG. 12a, the common voltage VCOM on the common electrode line 201 at a distal end is pulled to a greater extent. The closer to the proximal end, the common voltage VCOM on the common electrode line 201 is pulled to a smaller extent.

Figure 12B:
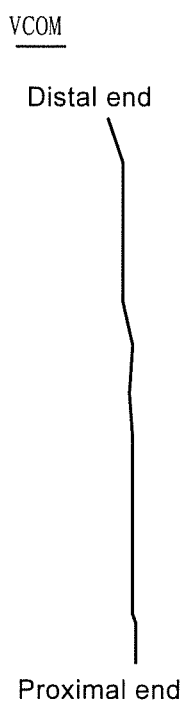
FIG. 12b is a variation curve of common voltages from a distal end to a proximal end after a common electrode is compensated according to some embodiments of the present disclosure.

In this case, the common voltage terminal Vcom connected to the output terminal O of the compensation sub-circuit 101 of the shift register may be connected to the common electrode line 201 at the distal end, so as to compensate the common voltage on a portion of the common electrode 200 that is away from the voltage source 202. Alternatively, the common voltage terminal Vcom connected to the output terminal O of the compensation sub-circuit 101 of the shift register may be connected to the common electrode lines 201 at the proximal end and the distal end to realize compensation of the common voltage, so that after compensation, the common voltages on the common electrode lines 201 from the proximal end to the distal end form approximately a straight line as shown in FIG. 12b.

Figure 13:
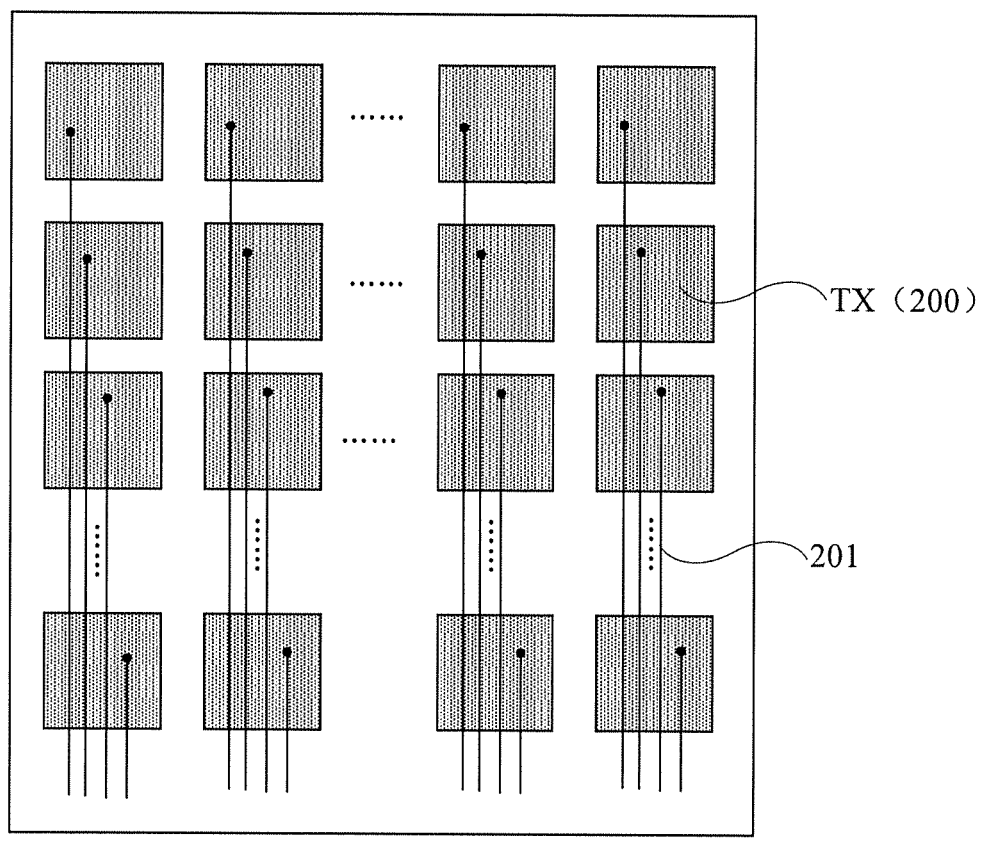
FIG. 13 is a schematic diagram of another arrangement manner of common electrodes according to some embodiments of the present disclosure.

In some other embodiments, the common electrodes 200 at the locations of the sub-pixels are not the same common electrode 200. For example, as shown in FIG. 13, for a touch and display driver integration (TDDI) display panel, the display panel has a plurality of block-shaped touch electrodes TX, and each touch electrode TX is also used as the common electrode 200 in a display phase. In this case, the common voltage on the common electrode 200 away from the voltage source 202 is easily pulled, thereby causing horizontal lines on the touch screen during display. In order to solve the above problem, in some embodiments, the common voltage terminal Vcom connected to the output terminal O of the compensation sub-circuit 101 in the shift register is connected to a touch lead which is also used as the common electrode line 201, so that a common voltage of a common electrode 200 that needs to be compensated, for example, a common voltage of the common electrode 200 at the distal end, is compensated through the common electrode line 201.

Moreover, in some embodiments, the description "the compensation sub-circuit 101 is connected to the pull-up node PU and/or the pull-down node PD, and a compensation signal terminal Vcp" refers to that the compensation sub-circuit 101 is connected to the pull-up node PU and the compensation signal terminal Vcp, so that the compensation sub-circuit 101 is able to output a voltage from the compensation signal terminal Vcp (i.e., a compensation voltage) to the output terminal O of the compensation sub-circuit under the control of a signal from the pull-up node PU. In some other embodiments, this description refers to that the compensation sub-circuit 101 is connected to the pull-down node PD and the compensation signal terminal Vcp, so that the compensation sub-circuit 101 is able to output a voltage from the compensation signal terminal Vcp (i.e., a compensation voltage) to the output terminal O of the compensation sub-circuit under the control of a signal from the pull-down node PD. In some other embodiments, the description refers to that the compensation sub-circuit 101 is connected to the pull-up node PU, the pull-down node PD and the compensation signal terminal Vcp, so that the compensation sub-circuit 101 is able to output a voltage of the compensation signal terminal Vcp (i.e., a compensation voltage) to the output terminal O of the compensation sub-circuit under the control of signals from the pull-up node PU and the pull-down node PD.

The pull-up node PU and the pull-down node PD in the shift register are generally in opposite states. For example, when the pull-up node PU is in an active state (e.g., a high level state), the pull-down node PD is in an inactive state (e.g., a low level state). Alternatively, when the pull-up node PU is in an inactive state (e.g., a low level state), the pull-down node PD is in an active state (e.g., a high level state).

Based on this, in a case where the shift register is applied to a display device, in the process of scanning the plurality of gate lines line by line through the plurality of shift registers connected in cascade, in a time period of an image frame, when one gate line receives a gate scanning signal output by the shift register via the signal output terminal Output, all remaining gate lines do not receive gate scanning signals, therefore when a pull-up node PU of a shift register in a certain stage in the plurality of shift registers connected in cascade is in an active state, the pull-up nodes PU of most of remaining shift registers are in an inactive state. Therefore, in the time period of an image frame, the pull-up node PU in the shift register is in an active state for a much shorter time than the pull-down node PD.

Based on this, in order to be able to perform voltage compensation on the common electrode for a long time to better ensure display quality, in some embodiments, as shown in FIG. 1, the compensation sub-circuit 101 is connected to the pull-up node PU, the pull-down node PD, and the compensation signal terminal Vcp, so that in the time period of an image frame, the common electrode may be compensated via the compensation signal terminal Vcp under the action of the pull-up node PU when the pull-up node PU is in an active state. When the pull-up node PU is in an inactive state, the common electrode may be compensated via the compensation signal terminal Vcp under the action of the pull-down node PD that is in an active state.

Figure 2:
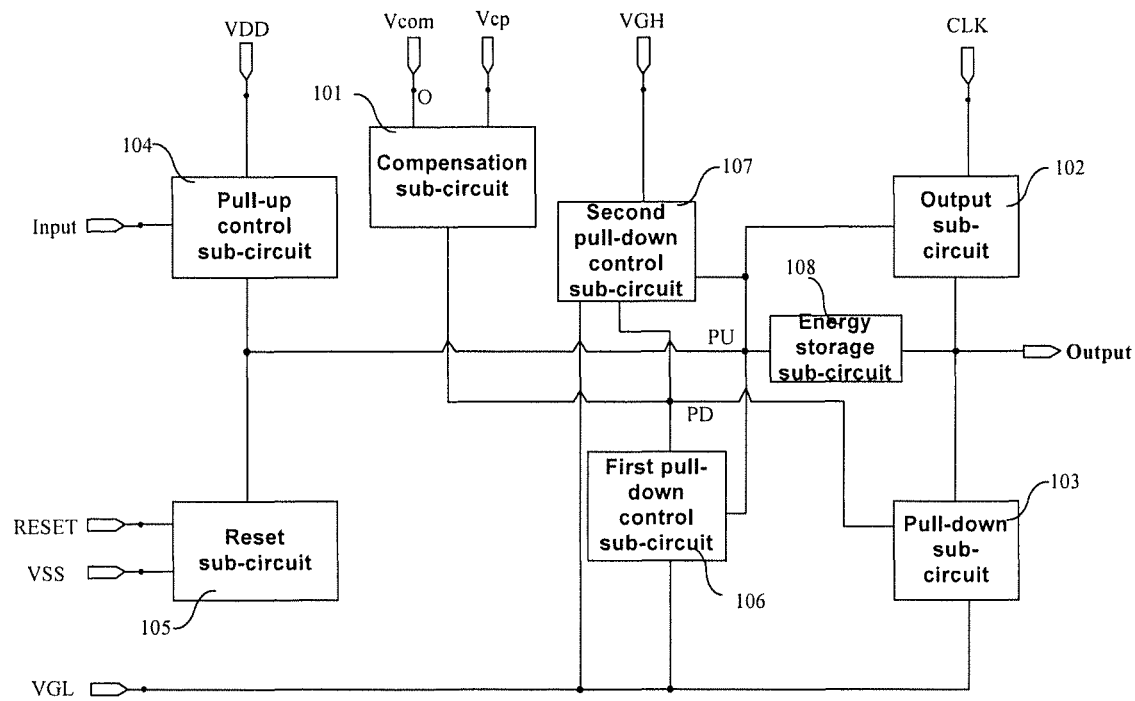
FIG. 2 is a schematic diagram showing a structure of another shift register according to some embodiments of the present disclosure.

Alternatively, as shown in FIG. 2, the compensation sub-circuit 101 is connected to the pull-down node PD and the compensation signal terminal Vcp, so that the common electrode may be compensated for a long time during a long period in which the pull-down node PD is in an active state.

Moreover, when the compensation sub-circuit 101 is not connected to the pull-up node PU, a potential of the pull-up node PU may be prevented from being pulled by the clock signal terminal CLK via the output sub-circuit 102, which may lead the pull-up node PU not to be affected by external coupling, and thus the voltage of the pull-up node PU may be stable, thereby enhancing a compensation effect of the compensation sub-circuit 101.

In summary, in the case where the shift register provided by the embodiments of the present disclosure is applied to a display device, during the process of controlling the pull-up node PU and the pull-down node PD in the shift register to output a gate scanning signal, the compensation sub-circuit 101 may be turned on via the pull-up node PU and/or the pull-down node PD, so that the compensation voltage of the compensation signal terminal Vcp may be output to a corresponding common electrode at positions of a corresponding row of sub-pixels in the display device to perform voltage compensation according to actually detected voltage of the common electrode.

Figure 3:
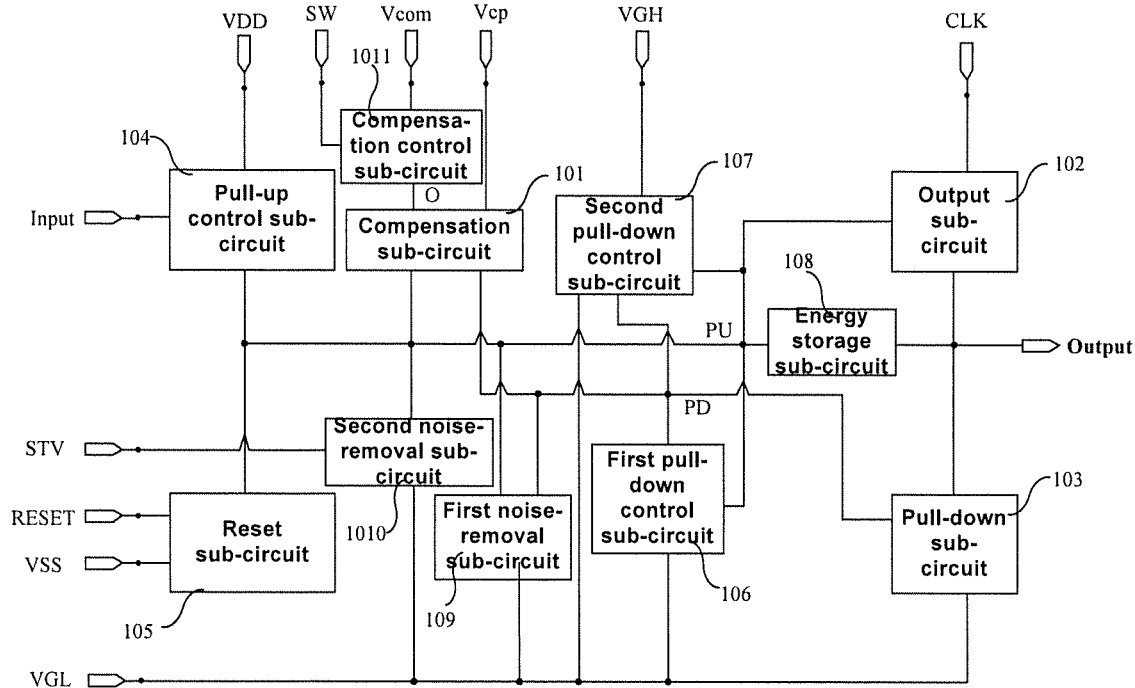
FIG. 3 is a schematic diagram showing a structure of yet another shift register according to some embodiments of the present disclosure.

On this basis, in order to control the compensation sub-circuit 101, so as to perform compensation according to actual detection results when compensation is needed, and not perform compensation when compensation is not needed, in some embodiments, as shown in FIG. 3, the shift register further includes a compensation control sub-circuit 1011 connected to a compensation control terminal SW.

The compensation control sub-circuit 1011 is further connected between the output terminal O of the compensation sub-circuit 101 and the common voltage terminal Vcom, and the compensation control sub-circuit 1011 is configured to output a voltage from the output terminal O of the compensation sub-circuit to the common voltage terminal Vcom under the control of a signal from the compensation control terminal SW.

Exemplary arrangement manners of the compensation sub-circuit 101 and the compensation control sub-circuit 1011 are further described below.

The compensation sub-circuit 101 may be disposed in the following manner.

Figure 4:
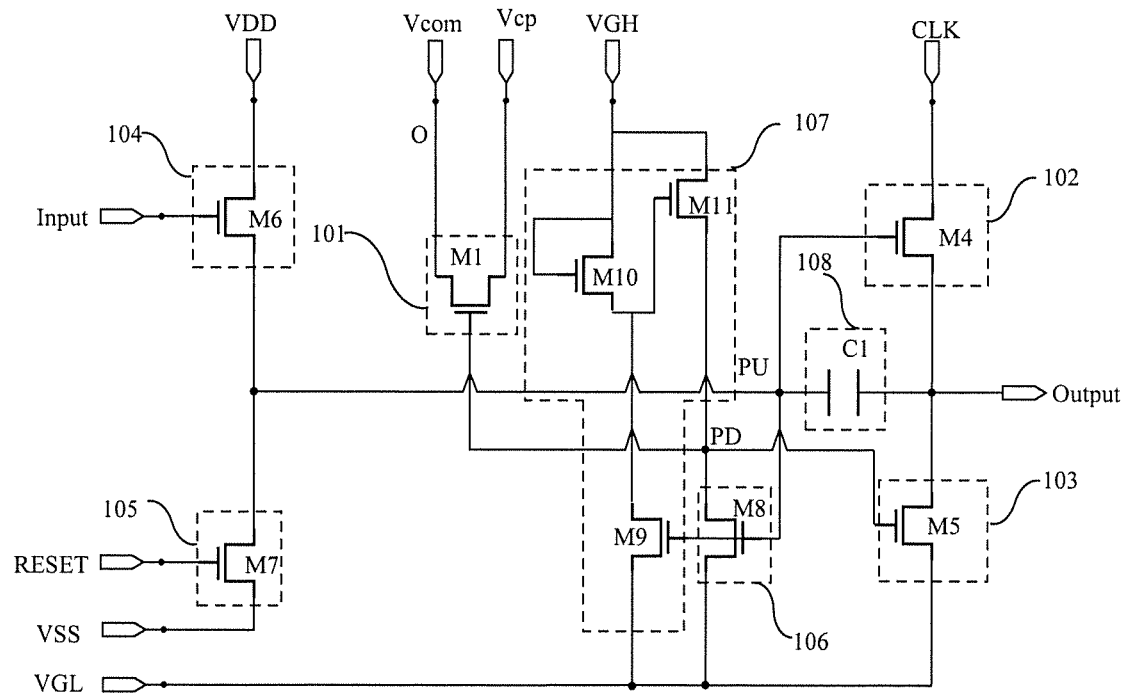
FIG. 4 is a schematic diagram showing a structure of yet another shift register according to some embodiments of the present disclosure.

For example, as shown in FIG. 4, the compensation sub-circuit 101 includes a first transistor M1. A gate electrode of the first transistor M1 is connected to the pull-down node PD (or the pull-up node PU), a first electrode of the first transistor M1 is connected to the compensation signal terminal Vcp, and a second electrode of the first transistor M1 is connected to the common voltage terminal Vcom as the output terminal O of the compensation sub-circuit.

It will be noted that in FIG. 4, the arrangement manner of the compensation sub-circuit 101 is only described by taking an example in which the gate electrode of the first transistor M1 is connected to the pull-down node PD. In some other embodiments, the gate electrode of the first transistor M1 is connected to the pull-up node PU, which is not described with reference to a drawing herein again.

Figure 5:
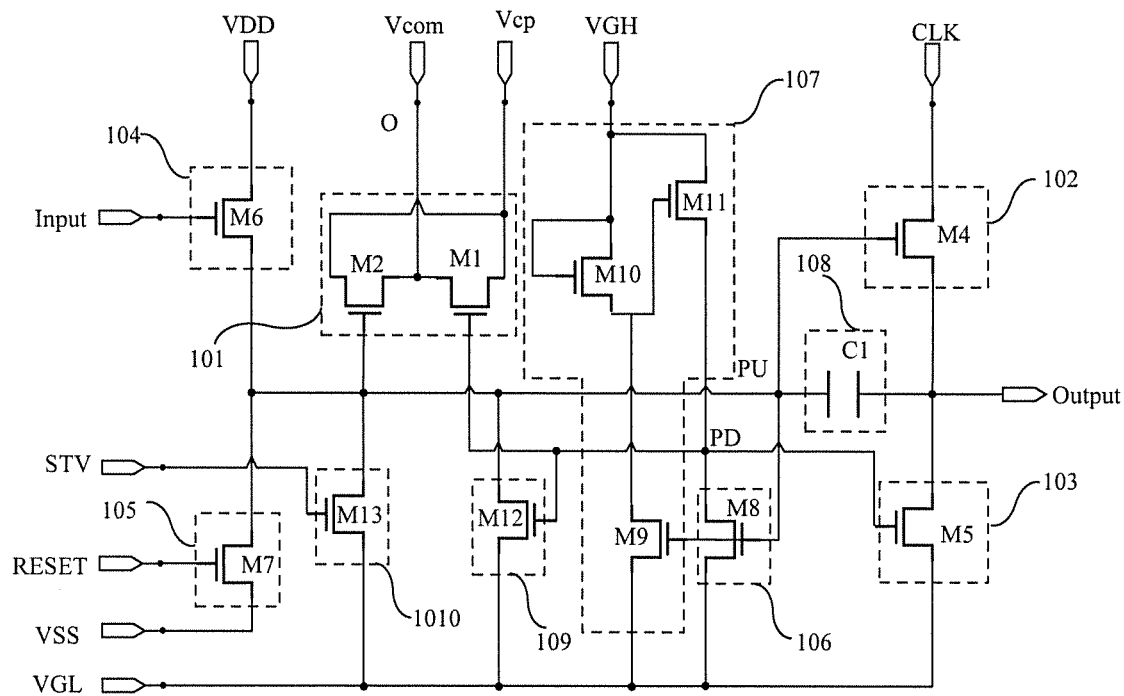
FIG. 5 is a schematic diagram showing a structure of yet another shift register according to some embodiments of the present disclosure.

For another example, as shown in FIG. 5, the compensation sub-circuit 101 includes a first transistor M1 and a second transistor M2. A gate electrode of the first transistor M1 is connected to the pull-down node PD, a first electrode of the first transistor M1 is connected to the compensation signal terminal Vcp, and a second electrode of the first transistor M1 is connected to the common voltage terminal Vcom as the output terminal O of the compensation sub-circuit. A gate electrode of the second transistor M2 is connected to the pull-up node PU, a first electrode of the second transistor M2 is connected to the compensation signal terminal Vcp, and a second electrode of the second transistor M2 is connected to the common voltage terminal Vcom as the output terminal O of the compensation sub-circuit.

Figure 6A:
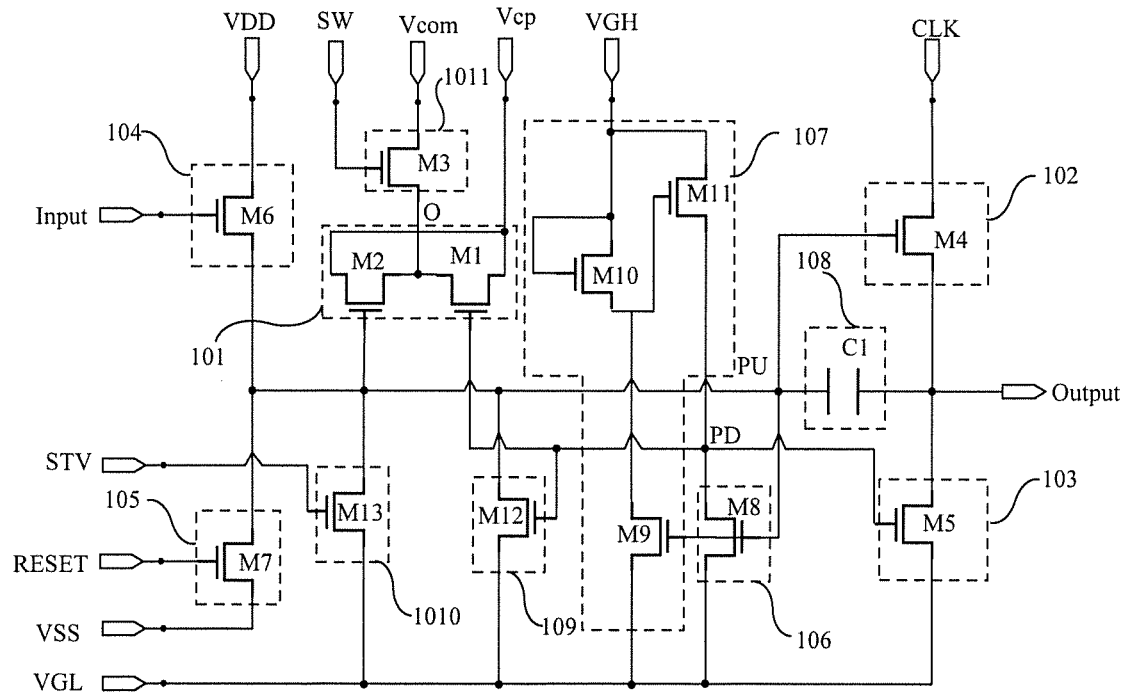
FIG. 6a is a schematic diagram showing a structure of yet another shift register according to some embodiments of the present disclosure.

As for the compensation control sub-circuit 1011, in some embodiments, as shown in FIG. 6a, the compensation control sub-circuit 1011 includes a third transistor M3. A gate electrode of the third transistor M3 is connected to the compensation control terminal SW, a first electrode of the third transistor M3 is connected to the output terminal O of the compensation sub-circuit, and a second electrode of the third transistor M3 is connected to the common voltage terminal Vcom.

It will be noted that, in a case where the shift register includes a compensation control sub-circuit 1011, a structure of the shift register is only described in FIG. 6a by taking an example in which the compensation sub-circuit 101 is connected to the pull-up node PU, the pull-down node PD, and the compensation signal terminal Vcp. Moreover, for shift registers in which the compensation sub-circuit 101 is connected to the pull-up node PU and the compensation signal terminal Vcp, and shift registers in which the compensation sub-circuit 101 is connected to the pull-down node PD and the compensation signal terminal Vcp as shown in FIG. 4, the compensation control sub-circuit 1011 may be arranged in a same manner as the compensation control sub-circuit 1011 shown in FIG. 6a, which will not be described with reference to a drawing herein again.

In addition, a connection manner of the compensation sub-circuit 101 and the compensation control sub-circuit 1011 and exemplary arrangement manners of the two sub-circuits can be applied to any shift register. Therefore, any arrangement manners including the connection manner of the compensation sub-circuit 101 and the compensation control sub-circuit 1011 and the exemplary arrangements of the two sub-circuits described above shall be included in the protection scope of the present disclosure.

As shown in FIG. 3, a shift register including a compensation sub-circuit 101 (an example is taken in which the compensation sub-circuit 101 is connected to the pull-up node PU, the pull-down node PD, and the compensation signal terminal Vcp) and a compensation control sub-circuit 1011 is provided. In addition to the compensation sub-circuit 101 and the compensation control sub-circuit 1011, in some embodiments, the shift register further includes an output sub-circuit 102, a pull-down sub-circuit 103, a pull-up control sub-circuit 104, a reset sub-circuit 105, a first pull-down control sub-circuit 106, a second pull-down control sub-circuit 107, and an energy storage sub-circuit 108.

For example, the output sub-circuit 102 is connected to a clock signal terminal CLK, the pull-up node PU, and the signal output terminal Output. The output sub-circuit 102 is configured to output a voltage from the clock signal terminal CLK to the signal output terminal Output under the control of a signal from the pull-up node PU.

The pull-down sub-circuit 103 is connected to the pull-down node PD, a first voltage terminal VGL, and the signal output terminal Output. The pull-down sub-circuit 103 is configured to output a voltage from the first voltage terminal VGL to the signal output terminal Output under the control of a signal from the pull-down node PD.

In some embodiments, a constant DC low level is input via the first voltage terminal VGL. In this case, when the pull-down sub-circuit 103 is turned on under the control of the pull-down node PD, a potential of the signal output terminal Output may be pulled down to the low level provided via the first voltage terminal VGL.

The pull-up control sub-circuit 104 is connected to the pull-up node PU, a signal input terminal Input, and a second voltage terminal VDD. The pull-up control sub-circuit 104 is configured to output a voltage from the second voltage terminal VDD to the pull-up node PU under the control of a signal from the signal input terminal Input.

In some embodiments, a constant DC high level is input via the second voltage terminal VDD. In this case, when the pull-up control sub-circuit 104 is turned on under the control of the signal input terminal Input, the high level provided via the second voltage terminal VDD may be output to the pull-up node PU, so as to charge the pull-up node PU.

The reset sub-circuit 105 is connected to a reset signal terminal RESET, a third voltage terminal VSS, and the pull-up node PU. The reset sub-circuit 105 is configured to output a voltage from the third voltage terminal VSS to the pull-up node PU under the control of a signal from the reset signal terminal RESET.

In some embodiments, a constant DC low level is input via the third voltage terminal VSS. In this case, the reset sub-circuit 105 is turned on under the control of the reset signal terminal RESET, so that the low level provided via the third voltage terminal VSS may be transmitted to the pull-up node PU to reset a potential of the pull-up node PU.

The first pull-down control sub-circuit 106 is connected to the first voltage terminal VGL, the pull-up node PU, and the pull-down node PD. The first pull-down control sub-circuit 106 is configured to output the voltage from the first voltage terminal VGL to the pull-down node PD under the control of a signal from the pull-up node PU. In a case where a low level is input via the first voltage terminal VGL, a potential of the pull-down node PD may be reset.

The second pull-down control sub-circuit 107 is connected to the first voltage terminal VGL, a fourth voltage terminal VGH, the pull-up node PU, and the pull-down node PD. The second pull-down control sub-circuit 107 is configured to output a voltage from the fourth voltage terminal VGH to the pull-down node PD under the control of a signal from the fourth voltage terminal VGH. Alternatively, the second pull-down control sub-circuit 107 is configured to receive a signal from the first voltage terminal VGL under the control of the pull-up node PU and stop outputting the voltage from the fourth voltage terminal VGH to the pull-down node PD. The energy storage sub-circuit 108 is connected between the pull-up node PU and the signal output terminal Output. The energy storage sub-circuit 108 is configured to store a voltage from the pull-up node PU, or to charge the pull-up node PU.

Moreover, in some embodiments, as shown in FIG. 3, the shift register further includes a first noise-removal sub-circuit 109, and/or, a second noise-removal sub-circuit 1010.

The first noise-removal sub-circuit 109 is connected to the first voltage terminal VGL, the pull-up node PU, and the pull-down node PD. The first noise-removal sub-circuit 109 is configured to output a voltage from the first voltage terminal VGL to the pull-up node PU under the control of a signal from the pull-down node PD, so as to remove noise of the pull-up node PU.

The second noise-removal sub-circuit 1010 is connected to an initial signal terminal STV, the first voltage terminal VGL, and the pull-up node PU. The second noise-removal sub-circuit 1010 is configured to output a voltage from the first voltage terminal VGL to the pull-up node PU under the control of a signal from the initial signal terminal STV, so as to remove noise of the pull-up node PU.

Referring to FIG. 6a, exemplary arrangement manners of the sub-circuits in the shift register are further described below.

The output sub-circuit 102 includes a fourth transistor M4. A gate electrode of the fourth transistor M4 is connected to the pull-up node PU, a first electrode of the fourth transistor M4 is connected to the clock signal terminal CLK, and a second electrode of the fourth transistor M4 is connected to the signal output terminal Output.

The pull-down sub-circuit 103 includes a fifth transistor M5. A gate electrode of the fifth transistor M5 is connected to the pull-down node PD, a first electrode of the fifth transistor M5 is connected to the first voltage terminal VGL, and a second electrode of the fifth transistor M5 is connected to the signal output terminal Output.

The pull-up control sub-circuit 104 includes a sixth transistor M6. A gate electrode of the sixth transistor M6 is connected to the signal input terminal Input, a first electrode of the sixth transistor M6 is connected to the second voltage terminal VDD, and a second electrode of the sixth transistor M6 is connected to the pull-up node PU.

The reset sub-circuit 105 includes a seventh transistor M7. A gate electrode of the seventh transistor M7 is connected to the reset signal terminal RESET, a first electrode of the seventh transistor M7 is connected to the third voltage terminal VSS, and a second electrode of the seventh transistor M7 is connected to the pull-up node PU.

The first pull-down control sub-circuit 106 includes an eighth transistor M8. A gate electrode of the eighth transistor M8 is connected to the pull-up node PU, a first electrode of the eighth transistor M8 is connected to the first voltage terminal VGL, and a second electrode of the eighth transistor M8 is connected to the pull-down node PD.

The second pull-down control sub-circuit 107 includes a ninth transistor M9, a tenth transistor M10, and an eleventh transistor M11.

A gate electrode of the ninth transistor M9 is connected to the pull-up node PU, a first electrode of the ninth transistor M9 is connected to the first voltage terminal VGL, and a second electrode of the ninth transistor M9 is connected to a gate electrode of the eleventh transistor M11.

A gate electrode and a first electrode of the tenth transistor M10 are connected to the fourth voltage terminal VGH, and a second electrode of the tenth transistor M10 is connected to the gate electrode of the eleventh transistor M11.

A first electrode of the eleventh transistor M11 is connected to the fourth voltage terminal VGH, and a second electrode of the eleventh transistor M11 is connected to the pull-down node PD.

The energy storage sub-circuit 108 includes a first capacitor C1. One end of the first capacitor C1 is connected to the pull-up node PU, and an opposite end of the first capacitor C1 is connected to the signal output terminal Output.

On this basis, as shown in FIG. 6a, the first noise-removal sub-circuit 109 includes a twelfth transistor M12. A gate electrode of the twelfth transistor M12 is connected to the pull-down node PD, a first electrode of the twelfth transistor M12 is connected to the first voltage terminal VGL, and a second electrode of the twelfth transistor M12 is connected to the pull-up node PU.

The second noise-removal sub-circuit 1010 includes a thirteenth transistor M13. A gate electrode of the thirteenth transistor M13 is connected to the initial signal terminal STV, a first electrode of the thirteenth transistor M13 is connected to the first voltage terminal VGL, and a second electrode of the thirteenth transistor M13 is connected to the pull-up node PU.

Figure 7:
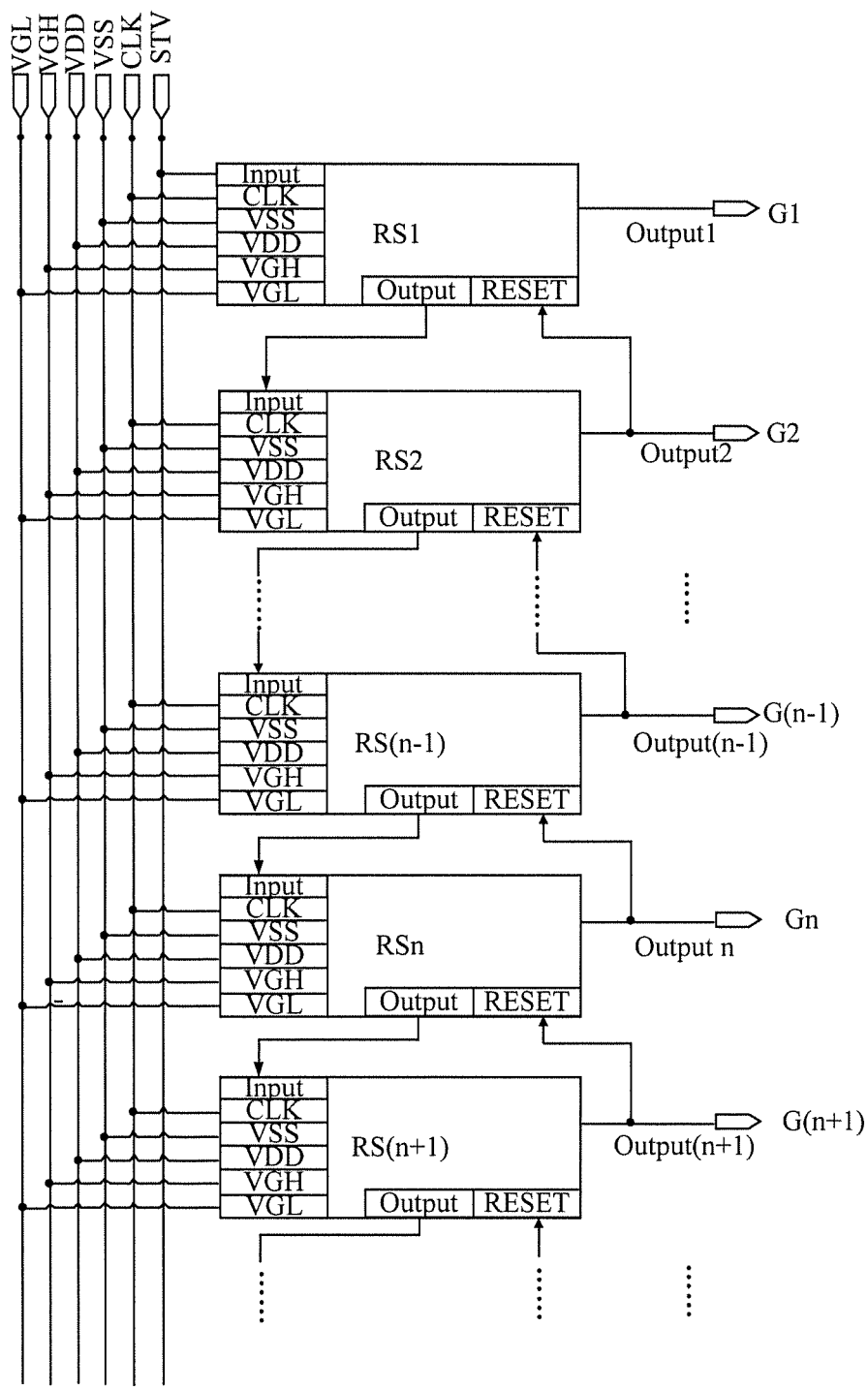
FIG. 7 is a schematic diagram showing a structure of a gate driving circuit according to some embodiments of the present disclosure.

Some embodiments of the present disclosure provide a gate driving circuit fabricated using a gate-on-array (GOA) technology. As shown in FIG. 7, the gate driving circuit includes at least two shift registers described above connected in cascade, and has the same structure and advantageous effects as the shift register provided by the foregoing embodiments. Since the structure and advantageous effects of the shift register have been described in detail in the foregoing embodiments, the structure and advantageous effects of the gate driving circuit will not be repeated herein.

In the gate driving circuit, a signal input terminal Input of a first-stage shift register RS1 is connected to a start signal terminal STV.

Except for the first-stage shift register RS1, a signal output terminal Output of a shift register in a previous stage RS(n−1) is connected to a signal input terminal Input of a shift register in a next stage RS(n).

It will be noted that a start signal is input via the start signal terminal STV. After the first-stage shift register RS1 of the gate driving circuit GOA receives the start signal, the entire gate driving circuit starts to scan gate lines (G1, G2 . . . Gn) line by line.

Moreover, in the gate driving circuit, except for a last-stage shift register, a signal output terminal Output of a shift register in a next stage RS(n) is connected to a reset signal terminal RESET of a shift register in a previous stage RS(n−1).

A reset signal terminal RESET of the last-stage shift register is connected to the start signal terminal STV. Alternatively, a signal terminal for providing a reset signal for the reset signal terminal RESET of the last-stage shift register is independently provided, and the signal terminal is connected to the reset signal terminal RESET of the last-stage shift register.

It will be noted that, in a case where the shift register includes the second noise-removal sub-circuit 1010, when a gate driving circuit including such a shift register scans the gate lines line by line, the noise on pull-up nodes PD in other shift registers may be removed when the first-stage shift register in the gate driving circuit is turned on through the initial signal terminal STV. That is to say, at the start of an image frame, noise of the entire screen may be removed through the second noise-removal sub-circuit 1010, so that the coupled noise generated by signals from the clock signal terminal CLK received by pull-up nodes PU in the entire gate driving circuit and the noise caused by external factors may be eliminated or reduced, thereby ensuring the stability of the signal output terminal Output.

It will be noted that, in the gate driving circuit formed by the above shift registers, the actual first voltage terminal VGL and the third voltage terminal VSS may be the same voltage terminal, and the second voltage terminal VDD and the fourth voltage terminal VGH may be the same voltage terminal.

The structures shown in FIGS. 4 to 6*a* enable forward scanning (e.g., scanning the gate lines line by line from top to bottom). In some embodiments, in order to realize reverse scanning (e.g., scanning the gate lines line by line from bottom to top), as shown in FIG. 6*b*, the gate electrode of the sixth transistor M6 is connected to the reset signal terminal RESET, and the first electrode of the sixth transistor M6 is connected to the third voltage terminal VSS. Moreover, the gate electrode of the seventh transistor M7 is connected to the signal input terminal Input, and the first electrode of the seventh transistor M7 is connected to the second voltage terminal VDD. Forward scanning is described above by taking the structure shown in FIG. 6*a* as an example. Arrangement manners shown in FIGS. 4 and 5 are similarly available, and will not be further described herein.

Some embodiments of the present disclosure provide a display device, which includes at least one common electrode and the gate driving circuit described above. At least one of common voltage terminals in the gate driving circuit is connected to at least one of the at least one common electrode (through at least one common electrode line). Since the display device includes the gate driving circuit described above, it has the same structure and advantageous effects as the gate driving circuit provided in the foregoing embodiments. Since the structure and advantageous effects of the gate driving circuit have been described in detail in the foregoing embodiments, the structure and advantageous effects of the display device will not be repeated herein.

It will be noted that, in some embodiments, the display device includes at least a liquid crystal display panel or an organic light-emitting diode display panel. For example, the display device is any product or component having a display function such as a liquid crystal display, a liquid crystal television, a digital photo frame, a mobile phone, or a tablet computer.

Some embodiments of the present disclosure provide a method of driving the shift register described above. Steps of the method of driving the shift register in different phases of an image frame are described in detail below with reference to FIG. 8 and in combination with practical applications of the shift registers in the gate driving circuit and the display device, and turned-on and cut-off states of each transistor in each sub-circuit in the shift register shown in FIG. 6*a*.

It will be noted that, the method is described by taking an example in which a high level is input via the second voltage terminal VDD and the fourth voltage terminal VGH, and a low level is input via the first voltage terminal VGL and the third voltage terminal VSS. In addition, turn-on and cut-off processes of transistors are described by taking an example in which all transistors are N-type transistors.

In an image frame, the method of driving the shift register includes the following four steps described in detail below.

A first phase P1 of the image frame:

The pull-up control sub-circuit 104 outputs a voltage from the second voltage terminal VDD to the pull-up node PU under the control of a signal from the input signal terminal Input, and the voltage from the second voltage terminal VDD is stored to the energy storage sub-circuit 108. In addition, the compensation sub-circuit 101 is turned on under the control of the pull-up node PU and the compensation control sub-circuit 1011, and outputs a voltage from the compensation signal terminal Vcp to the common voltage terminal Vcom.

Figure 8:
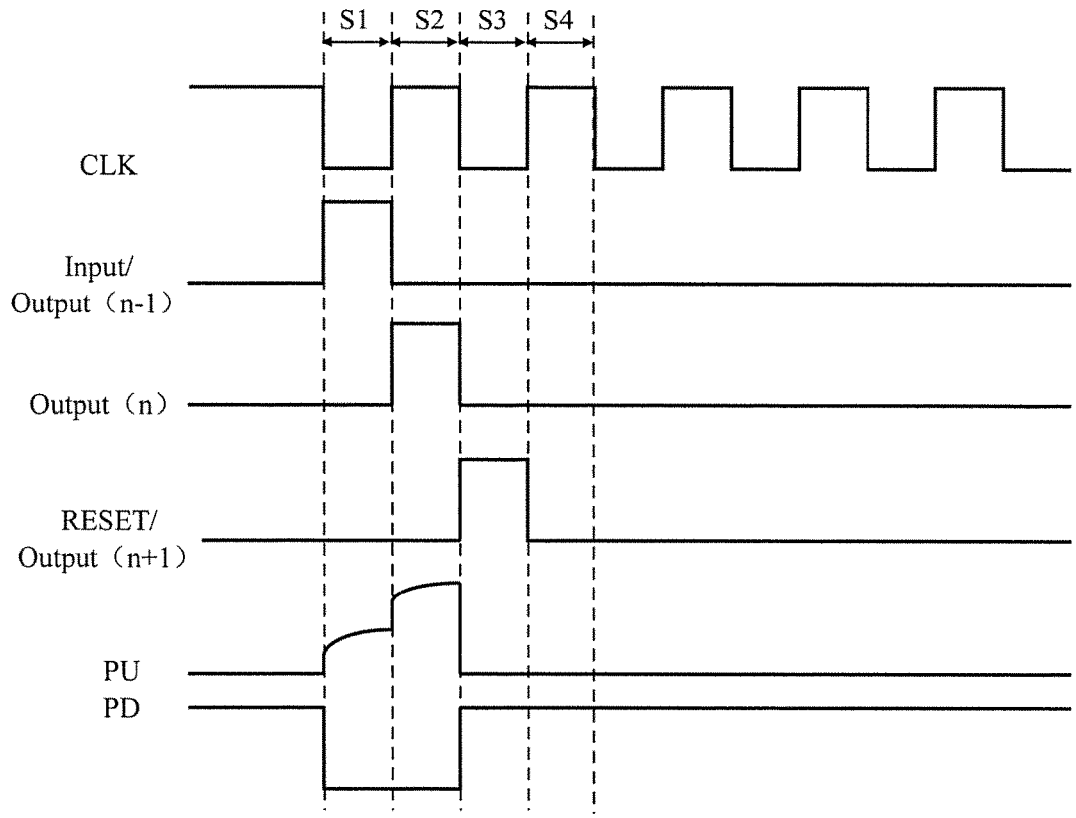
FIG. 8 is a timing diagram of control signals of a shift register according to some embodiments of the present disclosure.

For example, a high level is input via the signal input terminal Input, and a low level is input via the clock signal terminal CCK. With reference to FIG. 8 and the gate driving circuit in FIG. 7, a high level is input to the signal input terminal Input via the initial signal terminal STV, so as to make the gate driving circuit enter an active state. At this time, the first-stage shift register RS1 enters a charging state (i.e., charging the pull-up node PU), and shift registers RSn other than the first-stage shift register RS1 are in an inactive state. In this phase, under the control of the high level from the signal input terminal Input, the sixth transistor M6 in the pull-up control sub-circuit 104 is turned on and outputs the high level from the second voltage terminal VDD to the pull-up node PU to charge the pull-up node PU. Moreover, the high level from the second voltage terminal VDD is stored in the first capacitor C1 in the energy storage sub-circuit 108.

In addition, under the control of the high level of the pull-up node PU, the second transistor M2 of the compensation sub-circuit 101 is turned on and outputs a compensation voltage from the compensation signal terminal Vcp to the output terminal O of the compensation sub-circuit 101. In this case, whether or not the signal of the output terminal O of the compensation sub-circuit 101 is output to the common voltage terminal Vcom may be controlled depending on whether an actually detected voltage of the common voltage terminal Vcom (i.e., the common electrode) needs to be compensated.

For example, if a detection result indicates that the voltage of the common voltage terminal Vcom needs to be compensated, a high level is input to the compensation control terminal SW, so that the third transistor M3 is turned on, and the compensation voltage from the output terminal O of the compensation sub-circuit 101 (i.e., the voltage of the compensation signal terminal Vcp) is output to the common voltage terminal Vcom via the third transistor M3 for voltage compensation.

For another example, if the detection result indicates that the voltage of the common voltage terminal Vcom does not need to be compensated, a low level is input to the compensation control terminal SW, so that the third transistor M3 is cut off.

Moreover, under the control of the pull-up node PU, the fourth transistor M4 is turned on. Since a low level is input via the clock signal terminal CLK in this phase, the shift register outputs a low level via the signal output terminal Output. Therefore, there is no gate scanning signal output via the signal output terminal Output in this phase.

Under the control of the pull-up node PU, the eighth transistor M8 is turned on and pulls down a voltage of the pull-down node PD to a potential of the first voltage terminal VGL. Moreover, a width-to-length ratio of a channel of the ninth transistor M9 is set to greater than a width-to-length ratio of a channel of the tenth transistor M10, so that a conduction capability of the ninth transistor M9 is greater than a conduction capability of the tenth transistor M10. In this case, the ninth transistor M9 is turned on under the control of the pull-up node PU, therefore even if the tenth transistor M10 is also turned on, a voltage of the second electrode of the tenth transistor M10 will be pulled down to a potential of the first voltage terminal VGL via the ninth transistor M9 having a greater conduction capability, so that the eleventh transistor M11 is in a cut-off state.

The pull-down node PD is at a low level, and the twelfth transistor M12 and the fifth transistor M5 are cut off. In this phase, a low level is input via the reset signal terminal RESET, and the seventh transistor M7 is cut off.

It can be seen from the above that, at the start of an image frame, the thirteenth transistor M13 is turned on under the control of the initial signal terminal STV, so as to remove noise of a pull-up node PU in each stage of shift register. After entering the first phase P1, a low level is input via the initial signal terminal STV, and the thirteenth transistor M13 is cut off.

A second phase P2 of the image frame:

The energy storage sub-circuit 108 outputs the voltage stored in the first phase P1 to the pull-up node PU so that the output sub-circuit 102 is turned on, and the output sub-circuit 102 outputs a voltage from the clock signal terminal CLK to the signal output terminal Output. The compensation sub-circuit 101 maintains in a turned-on state under the control of the pull-up node PU and the compensation control sub-circuit 1011, and outputs a voltage from the compensation signal terminal Vcp to the common voltage terminal Vcom.

In some embodiments, in this phase, a high level is input via the clock signal terminal CLK, and a low level is input via the signal input terminal Input. A first capacitor C1 in the energy storage sub-circuit 108 outputs the high level stored in the first phase P1 to the pull-up node PU, and under the control of the high level of the pull-up node PU, the fourth transistor M4 in the output sub-circuit 102 is turned on and outputs the high level from the clock signal terminal CLK to the signal output terminal Output. At the same time, under the bootstrap action of the first capacitor C1, a potential of the pull-up node PU may be further pulled up, so as to ensure that the fourth transistor M4 maintains in a stable turned-on state and continuously outputs the high level from the clock signal terminal CLK to the signal output terminal Output.

In addition, under the control of the high level of the pull-up node PU, turned-on and cut-off states of transistors in the compensation sub-circuit 101 and the compensation control sub-circuit 1011 are the same as in the first phase P1, and the compensation process is also the same as in the first phase P1, therefore details are not described herein again.

Since a low level is input via the signal input terminal Input, the sixth transistor M6 is cut off. Turned-on and cut-off states of remaining transistors are similarly available, and are not described herein again.

In summary, a high level, i.e., a gate scanning signal, is output via the signal output terminal Output in this phase.

A third phase P3 of the image frame:

The reset sub-circuit 105 outputs a voltage from the third voltage terminal VSS to the pull-up node PU under the control of the reset signal terminal RESET. The second pull-down control sub-circuit 107 outputs a voltage from the fourth voltage terminal VGH to the pull-down node PD under the control of the fourth voltage terminal VGH.

In addition, the pull-down sub-circuit 103 is turned on under the control of the pull-down node PD, and outputs a voltage from the first voltage terminal VGL to the signal output terminal Output. The compensation sub-circuit 101 is turned on under the control of the pull-down node PD and the compensation control sub-circuit 1011, and outputs a voltage from the compensation signal terminal Vcp to the common voltage terminal Vcom.

In some embodiments, a high level is input via the reset signal terminal RESET in this phase. With reference to FIG. 8 and the gate driving circuit in FIG. 7, for shift registers RSn other than the last-stage shift register, the high level output by a shift register in a next stage RS(n+1) via its signal output terminal Output(n+1) is input to the reset signal terminal RESET of the shift register RSn. A high level may be input to the reset signal terminal RESET of the last-stage shift register separately or via the start signal terminal STV.

In this phase, under the control of the high level from the reset signal terminal RESET, the seventh transistor M7 in the reset sub-circuit 105 is turned on and outputs the low level from third voltage terminal VSS to the pull-up node PU.

Under the control of the low level of the pull-up node PU, the eighth transistor M8 in the first pull-down control sub-circuit 106 is in a cut-off state, and the ninth transistor M9 in the second pull-down control sub-circuit 107 is in a cut-off state. In addition, under the control of the high level from the fourth voltage terminal VGH, the tenth transistor M10 and the eleventh transistor M11 are turned on, and the eleventh transistor M11 outputs the high level from the fourth voltage terminal VGH to the pull-down node PD.

Under the control of the high level of the pull-down node PD, the fifth transistor M5 in the pull-down sub-circuit 103 is turned on and outputs the low level from the first voltage terminal VGL to the signal output terminal Output.

Moreover, under the control of the high level of the pull-down node PD, the first transistor M1 in the compensation sub-circuit 101 is turned on and outputs the compensation voltage from the compensation signal terminal Vcp to the output terminal O of the compensation sub-circuit 101. At the same time, whether the signal from the output terminal O of the compensation sub-circuit 101 is output to the common voltage terminal Vcom may be controlled depending on whether an actually detected voltage of the common voltage terminal Vcom (i.e., the common electrode) needs to be compensated. If compensation is needed, a high level is input via the compensation control terminal SW, so that the third transistor M3 is turned on, and the compensation voltage from the output terminal O of the compensation sub-circuit 101 is output to the common voltage terminal Vcom via the third transistor M3 for voltage compensation. If compensation is not needed, a low level is input via the compensation control terminal SW, so that the third transistor M3 is cut off.

In addition, under the control of the high level of the pull-down node PD, the twelfth transistor M12 in the first noise-removal sub-circuit 109 is turned on so as to output the low level from the first voltage terminal VGL to the pull-up node PU. At this time, the fourth transistor M4 is cut off.

Turned-on and cut-off states of remaining transistors are similarly available, and are not described herein again.

In summary, a low level is output via the signal output terminal Output in this phase.

A fourth phase P4 of the image frame:

The pull-down sub-circuit 103 maintains in a turned-on state under the control of the pull-down node PD, and outputs a voltage from the first voltage terminal VGL to the signal output terminal Output. The compensation sub-circuit 101 is turned on under the control of the pull-down node PD and the compensation control sub-circuit 1011, and outputs a voltage from the compensation signal terminal Vcp to the common voltage terminal Vcom.

In some embodiments, in this phase, the pull-up node PU maintains at a low level, the eighth transistor M8 in the first pull-down control sub-circuit 106 maintains in a cut-off state, and the ninth transistor M9 in the second pull-down control sub-circuit 107 maintains in a cut-off state. In addition, under the control of the high level from the fourth voltage terminal VGH, the tenth transistor M10 and the eleventh transistor M11 are turned on and the eleventh transistor M11 outputs the high level from the fourth voltage terminal VGH to the pull-down node PD.

Under the control of the high level of the pull-down node PD, the fifth transistor M5 in the pull-down sub-circuit 103 is turned on and outputs the low level from the first voltage terminal VGL to the signal output terminal Output.

In addition, under the control of the high level of the pull-down node PD, turned-on and cut-off states of transistors in the compensation sub-circuit 101 and the compensation control sub-circuit 1011 are the same as in the third phase P3, and the compensation process is also the same as in the third phase P3, therefore details are not described herein again.

In addition, under the control of the high level of the pull-down node PD, the twelfth transistor M12 in the first noise-removal sub-circuit 109 is turned on, so as to output the low level of the first voltage terminal VGL to the pull-up node PU for noise removal.

In summary, a low level is output via the signal output terminal Output in this phase.

Before the start of a next image frame, the fourth phase P4 is repeated, so that the low level from the first voltage terminal VGL is continuously output via the signal output terminal Output, and the pull-down node PD maintains at a high level. The turned-on and cut-off states of the transistors in the compensation sub-circuit 101 and the compensation control sub-circuit 1011 are the same as in the fourth phase P4, and the compensation process is also the same as in the fourth phase P4, and details are not described herein again.

It will be noted that the turn-on and cut-off processes of transistors in the above embodiments are described by taking an example in which all transistors are N-type transistors. When all the transistors are P-type transistors, all control signals in FIG. 8 need to be flipped, and sub-circuits or transistors connected to the second voltage terminal VDD and the fourth voltage terminal VGH in FIG. 6a need to be connected to voltage terminals that output a low level. Sub-circuits or transistors connected to the first voltage terminal VGL and the third voltage terminal VSS need to be connected to voltage terminals that output a high level.

The method of driving the shift register is described by taking an example in which the compensating sub-circuit 101 in the shift register is connected to both the pull-up node PU and the pull-down node PD, as shown in FIG. 6a. Of course, in a case where the compensation sub-circuit 101 is connected to the pull-down node PD (as shown in FIG. 4), reference may be made to on and off states of the compensation sub-circuit 101 in the third phase P3 and the fourth phase P4 in the method of driving the shift register described above.

Alternatively, in a case where the compensation sub-circuit 101 is connected to the pull-up node PU, reference may be made to on and off states of the compensation sub-circuit 101 in the first phase P1 and the second phase P2 in the method of driving the shift register described above.

In addition, the above method is described only by taking an example in which the shift register includes a compensation control sub-circuit 1011, and the voltage of the output terminal of the compensation sub-circuit is output to the common voltage terminal Vcom under the control of the compensation control sub-circuit 1011, as shown in FIG. 6a. Of course, in practice, the shift register may not include a compensation control sub-circuit 1011, as shown in FIGS. 1, 2, 4, and 5.

The exemplary compensation process of outputting the voltage of the output terminal of the compensation sub-circuit to the common voltage terminal Vcom under two circumstances in which the shift register of the gate driving circuit includes a compensation control sub-circuit 1011 and in which the shift register does not include a compensation control sub-circuit 1011 is further explained below.

Figure 9:
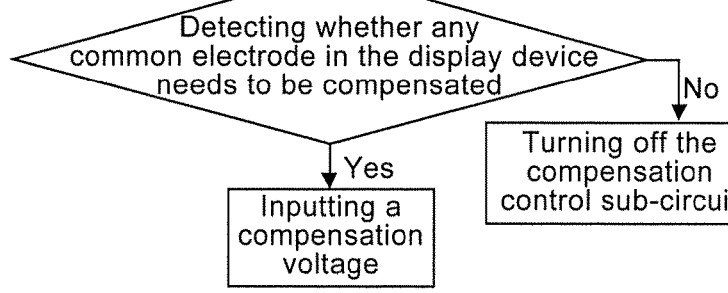
FIG. 9 is a flowchart of a compensation process according to some embodiments of the present disclosure.

For example, the shift register includes a compensation control sub-circuit 1011, and as shown in FIG. 9, the compensation process includes the following steps.

Figure 6B:
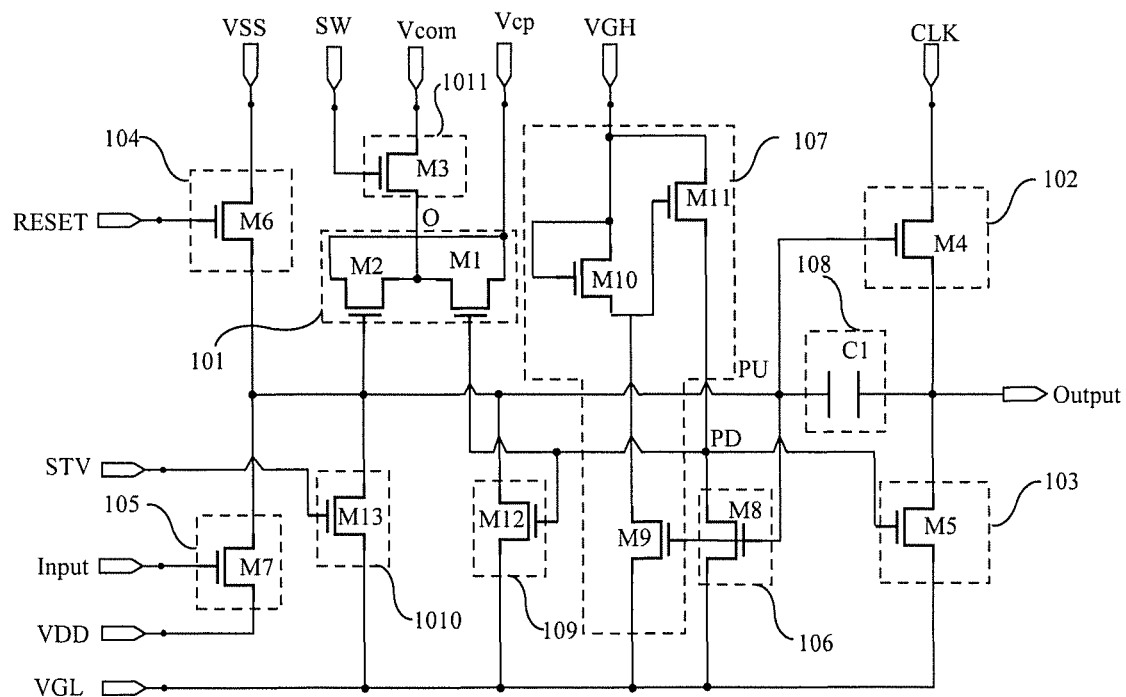
FIG. 6b is a schematic diagram showing a structure of yet another shift register according to some embodiments of the present disclosure.

In step 1, the gate driving circuit is turned on, and the compensation control sub-circuits 1011 in each stage of shift register in the gate driving circuit is turned on (i.e., a high level is input via the compensation control terminal SW to turn on the third transistor M3, as shown in FIGS. 6a and 6b).

In step 2, whether any common electrode in the display device needs to be compensated is detected. A compensation voltage is input to the common electrode via a compensation signal terminal Vcp in the shift register of the gate driving circuit corresponding to the common electrode if compensation is needed, and the compensation control sub-circuit 1011 is turned off (i.e., a low level is input via the compensation control terminal SW to cut off the third transistor M3) if compensation is not needed.

Figure 10:
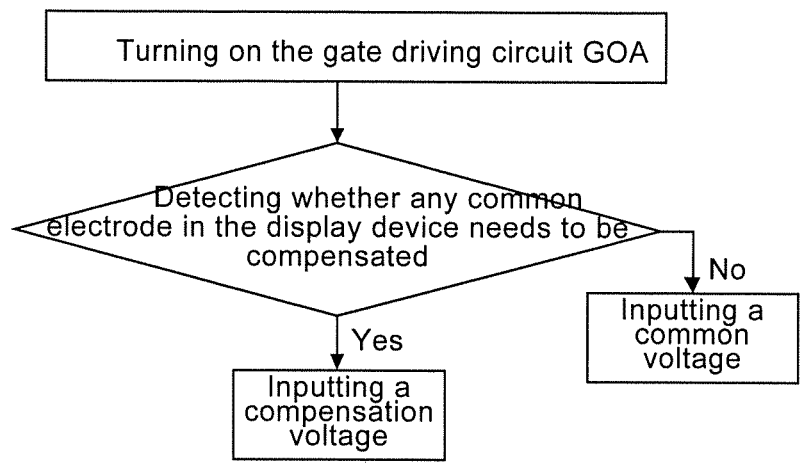
FIG. 10 is a flowchart of another compensation process according to some embodiments of the present disclosure.

For another example, the shift register does not include a compensation control sub-circuit 1011, and as shown in FIG. 10, the compensation process includes the following steps.

In step 1, the gate driving circuit is turned on.

In step 2, whether any common electrode in the display device needs to be compensated is detected. A compensation voltage is input to the common electrode via a compensation signal terminal Vcp in the shift register in the gate driving circuit corresponding to the common electrode if compensation is needed, and an actual common voltage is input to the common electrode via a compensation signal terminal Vcp in the shift register in the gate driving circuit corresponding to the common electrode if compensation is not needed, so as to improve a driving capability of the common electrode.

It will be noted that, as for the step of detecting whether any common electrode in the display device needs to be compensated, the detection may be an overall detection of the display device before the gate driving circuit is turned on, or the detection may be performed line by line according to how the common voltage terminal Vcom is pulled after the gate driving circuit is turned on, which is not limited in the present disclosure, and an appropriate detection mode may be selected according to actual needs.

For example, in the case where the shift register includes a compensation control sub-circuit 1011, when the gate driving circuit is turned on, the compensation control sub-circuit 1011 is also turned on. In a case where the compensation sub-circuit 101 is turned on, it is first detected whether the voltage of the common voltage terminal Vcom (i.e., the common electrode) needs to be compensated. If compensation is needed, a compensation voltage is input to the common electrode via the compensation signal terminal Vcp. If compensation is not needed, the compensation control sub-circuit 1011 is turned off. Of course, this is only an illustrative description. In practice, other compensation processes may be selected as needed.

The foregoing descriptions are merely some implementation manners of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A shift register, comprising:
    a pull-up node configured to control a signal output terminal of the shift register to output a gate scanning signal;
    a pull-down node configured to stop the signal output terminal of the shift register from outputting the gate scanning signal; and
    a compensation sub-circuit connected to the pull-up node and/or the pull-down node, a compensation signal terminal, and a common voltage terminal, wherein the compensation sub-circuit is configured to output a voltage from the compensation signal terminal to an output terminal of the compensation sub-circuit under a control of a signal from the pull-up node and/or a signal from the pull-down node, and the output terminal of the compensation sub-circuit is connected to the common voltage terminal.

2. The shift register according to claim 1, further comprising a compensation control sub-circuit connected to a compensation control terminal, wherein
    the compensation control sub-circuit is further connected between the output terminal of the compensation sub-circuit and the common voltage terminal, and the compensation control sub-circuit is configured to output a voltage from the output terminal of the compensation sub-circuit to the common voltage terminal under a control of a signal from the compensation control terminal.

3. The shift register according to claim 1, wherein
    the compensation sub-circuit comprises a first transistor;
    a gate electrode of the first transistor is connected to the pull-down node or the pull-up node, a first electrode of the first transistor is connected to the compensation signal terminal, and a second electrode of the first transistor is connected to the common voltage terminal as the output terminal of the compensation sub-circuit.

4. The shift register according to claim 1, wherein
    the compensation sub-circuit comprises a first transistor and a second transistor;
    a gate electrode of the first transistor is connected to the pull-down node, a first electrode of the first transistor is connected to the compensation signal terminal, and a second electrode of the first transistor is connected to the common voltage terminal as the output terminal of the compensation sub-circuit;
    a gate electrode of the second transistor is connected to the pull-up node, a first electrode of the second transistor is connected to the compensation signal terminal, and a second electrode of the second transistor is connected to the common voltage terminal as the output terminal of the compensation sub-circuit.

5. The shift register according to claim 2, wherein the compensation control sub-circuit comprises a third transistor;
    a gate electrode of the third transistor is connected to the compensation control terminal, a first electrode of the third transistor is connected to the output terminal of the compensation sub-circuit, and a second electrode of the third transistor is connected to the common voltage terminal.

6. The shift register according to claim 1, further comprising an output sub-circuit, a pull-down sub-circuit, a pull-up control sub-circuit, a reset sub-circuit, a first pull-down control sub-circuit, a second pull-down control sub-circuit, and an energy storage sub-circuit, wherein
    the output sub-circuit is connected to a clock signal terminal, the pull-up node, and the signal output terminal, and the output sub-circuit is configured to output a voltage from the clock signal terminal to the signal output terminal under a control of a signal from the pull-up node;
    the pull-down sub-circuit is connected to the pull-down node, a first voltage terminal, and the signal output terminal, and the pull-down sub-circuit is configured to output a voltage from the first voltage terminal to the signal output terminal under a control of a signal from the pull-down node;
    the pull-up control sub-circuit is connected to the pull-up node, a signal input terminal, and a second voltage terminal, and the pull-up control sub-circuit is configured to output a voltage from the second voltage terminal to the pull-up node under a control of a signal from the signal input terminal;
    the reset sub-circuit is connected to a reset signal terminal, a third voltage terminal, and the pull-up node, and the reset sub-circuit is configured to output a voltage from the third voltage terminal to the pull-up node under a control of a signal from the reset signal terminal;
    the first pull-down control sub-circuit is connected to the first voltage terminal, the pull-up node, and the pull-down node, and the first pull-down control sub-circuit is configured to output a voltage from the first voltage terminal to the pull-down node under a control of a signal from the pull-up node;
    the second pull-down control sub-circuit is connected to the first voltage terminal, a fourth voltage terminal, the pull-up node, and the pull-down node, and the second pull-down control sub-circuit is configured to output a voltage from the fourth voltage terminal to the pull-down node under a control of a signal from the fourth voltage terminal; or, the second pull-down control sub-circuit is configured to receive a signal from the first voltage terminal and stop outputting the voltage from the fourth voltage terminal to the pull-down node under a control of the pull-up node; and
    the energy storage sub-circuit is connected between the pull-up node and the signal output terminal, and the energy storage sub-circuit is configured to store a voltage of the pull-up node or to charge the pull-up node.

7. The shift register according to claim 6, further comprising a first noise-removal sub-circuit, and/or a second noise-removal sub-circuit, wherein the first noise-removal sub-circuit is connected to the first voltage terminal, the pull-up node, and the pull-down node, and the first noise-removal sub-circuit is configured to output a voltage from the first voltage terminal to the pull-up node under a control of a signal from the pull-down node;

the second noise-removal sub-circuit is connected to an initial signal terminal, the first voltage terminal, and the pull-up node, and the second noise-removal sub-circuit is configured to output a voltage from the first voltage terminal to the pull-up node under a control of a signal from the initial signal terminal.

8. The shift register according to claim 6, wherein the output sub-circuit comprises a fourth transistor; a gate electrode of the fourth transistor is connected to the pull-up node, a first electrode of the fourth transistor is connected to the clock signal terminal, and a second electrode of the fourth transistor is connected to the signal output terminal;

the pull-down sub-circuit comprises a fifth transistor; a gate electrode of the fifth transistor is connected to the pull-down node, a first electrode of the fifth transistor is connected to the first voltage terminal, and a second electrode of the fifth transistor is connected to the signal output terminal;

the pull-up control sub-circuit comprises a sixth transistor; a gate electrode of the sixth transistor is connected to the signal input terminal, a first electrode of the sixth transistor is connected to the second voltage terminal, and a second electrode of the sixth transistor is connected to the pull-up node;

the reset sub-circuit comprises a seventh transistor; a gate electrode of the seventh transistor is connected to the reset signal terminal, a first electrode of the seventh transistor is connected to the third voltage terminal, and a second electrode of the seventh transistor is connected to the pull-up node;

the first pull-down control sub-circuit comprises an eighth transistor; a gate electrode of the eighth transistor is connected to the pull-up node, a first electrode of the eighth transistor is connected to the first voltage terminal, and a second electrode of the eighth transistor is connected to the pull-down node;

the second pull-down control sub-circuit comprises a ninth transistor, a tenth transistor, and an eleventh transistor; a gate electrode of the ninth transistor is connected to the pull-up node, a first electrode of the ninth transistor is connected to the first voltage terminal, and a second electrode of the ninth transistor is connected to a gate electrode of the eleventh transistor; a gate electrode and a first electrode of the tenth transistor are connected to the fourth voltage terminal, and a second electrode of the tenth transistor is connected to the gate electrode of the eleventh transistor; a first electrode of the eleventh transistor is connected to the fourth voltage terminal, and a second electrode of the eleventh transistor is connected to the pull-down node;

the energy storage sub-circuit comprises a first capacitor; one end of the first capacitor is connected to the pull-up node, and an opposite end of the first capacitor is connected to the signal output terminal.

9. The shift register according to claim 7, wherein the first noise-removal sub-circuit comprises a twelfth transistor; a gate electrode of the twelfth transistor is connected to the pull-down node, a first electrode of the twelfth transistor is connected to the first voltage terminal, and a second electrode of the twelfth transistor is connected to the pull-up node;

the second noise-removal sub-circuit comprises a thirteenth transistor; a gate electrode of the thirteenth transistor is connected to the initial signal terminal, a first electrode of the thirteenth transistor is connected to the first voltage terminal, and a second electrode of the thirteenth transistor is connected to the pull-up node.

10. A gate driving circuit, comprising at least two shift registers according to claim 1 connected in cascade, wherein a signal input terminal of a first-stage shift register is connected to a start signal terminal;

except for the first-stage shift register, a signal output terminal of a shift register in a previous stage is connected to a signal input terminal of a shift register in a next stage;

except for a last-stage shift register, a signal output terminal of a shift register in a next stage is connected to a reset signal terminal of a shift register in a previous stage; and a reset signal terminal of the last-stage shift register is connected to the start signal terminal.

11. A display device, comprising at least one common electrode and the gate driving circuit according to claim 10, wherein at least one of common voltage terminals of the gate driving circuit is connected to at least one of the at least one common electrode.

12. A method of driving a shift register, the shift register comprising:

a pull-up node configured to control a signal output terminal of the shift register to output a gate scanning signal;

a pull-down node configured to stop the signal output terminal of the shift register from outputting the gate scanning signal; and a compensation sub-circuit connected to the pull-up node and/or the pull-down node, a compensation signal terminal, and a common voltage terminal, wherein the compensation sub-circuit is configured to output a voltage from the compensation signal terminal to an output terminal of the compensation sub-circuit under a control of a signal from the pull-up node and/or a signal from the pull-down node, and the output terminal of the compensation sub-circuit is connected to the common voltage terminal;

the shift register further comprising an output sub-circuit, a pull-down sub-circuit, a pull-up control sub-circuit, a reset sub-circuit, a first pull-down control sub-circuit, a second pull-down control sub-circuit, and an energy storage sub-circuit, wherein the output sub-circuit is connected to a clock signal terminal, the pull-up node, and the signal output terminal, and the output sub-circuit is configured to output a voltage from the clock signal terminal to the signal output terminal under a control of a signal from the pull-up node;

the pull-down sub-circuit is connected to the pull-down node, a first voltage terminal, and the signal output terminal, and the pull-down sub-circuit is configured to output a voltage from the first voltage terminal to the signal output terminal under a control of a signal from the pull-down node;

the pull-up control sub-circuit is connected to the pull-up node, a signal input terminal, and a second voltage terminal, and the pull-up control sub-circuit is configured to output a voltage from the second voltage terminal to the pull-up node under a control of a signal from the signal input terminal;

the reset sub-circuit is connected to a reset signal terminal, a third voltage terminal, and the pull-up node, and the reset sub-circuit is configured to output a voltage from the third voltage terminal to the pull-up node under a control of a signal from the reset signal terminal;

the first pull-down control sub-circuit is connected to the first voltage terminal, the pull-up node, and the pull-down node, and the first pull-down control sub-circuit is configured to output a voltage from the first voltage terminal to the pull-down node under a control of a signal from the pull-up node;

the second pull-down control sub-circuit is connected to the first voltage terminal, a fourth voltage terminal, the pull-up node, and the pull-down node, and the second pull-down control sub-circuit is configured to output a voltage from the fourth voltage terminal to the pull-down node under a control of a signal from the fourth voltage terminal; or, the second pull-down control sub-circuit is configured to receive a signal from the first voltage terminal and stop outputting the voltage from the fourth voltage terminal to the pull-down node under a control of the pull-up node; and the energy storage sub-circuit is connected between the pull-up node and the signal output terminal, and the energy storage sub-circuit is configured to store a voltage of the pull-up node or to charge the pull-up node;

wherein in an image frame, the method comprises:

in a first phase, outputting, by the pull-up control sub-circuit, a voltage from the second voltage terminal to the pull-up node under a control of a signal from the signal input terminal, and storing the voltage from the second voltage terminal to the energy storage sub-circuit;

in a second phase, outputting, by the energy storage sub-circuit, the voltage stored in the first phase to the pull-up node, controlling, by the pull-up node, the output sub-circuit to be turned on, and outputting, by the output sub-circuit, a voltage from the clock signal terminal to the signal output terminal;

in a third phase, outputting, by the reset sub-circuit, a voltage from the third voltage terminal to the pull-up node under a control of a signal from the reset signal terminal;

outputting, by the second pull-down control sub-circuit, a voltage from the fourth voltage terminal to the pull-down node under a control of a signal from the fourth voltage terminal, controlling, by the pull-down node, the pull-down sub-circuit to be turned on, and outputting, by the pull-down sub-circuit, a voltage from the first voltage terminal to the signal output terminal;

in a fourth stage, controlling, by the pull-down node, the pull-down sub-circuit to maintain in a turned-on state, and outputting, by the pull-down sub-circuit, a voltage from the first voltage terminal to the signal output terminal; and repeating the fourth phase before a start of a next image frame to make a voltage from the first voltage terminal to be constantly output via the signal output terminal, wherein in a case where the compensation sub-circuit is connected to the pull-up node, in the first phase and the second phase, the compensation sub-circuit is turned on under a control of a signal from the pull-up node, and outputs a voltage from the compensation signal terminal to an output terminal of the compensation sub-circuit; and in a case where the compensation sub-circuit is connected to the pull-down node, from the third phase to the start of the next image frame, the compensation sub-circuit is turned on under a control of a signal from the pull-down node, and outputs a voltage from the compensation signal terminal to the output terminal of the compensation sub-circuit.

13. The method of driving a shift register according to claim 12, wherein the shift register further comprises a compensation control sub-circuit, the method further comprises:

determining whether a voltage of the common voltage terminal needs to be compensated; and outputting, by the compensation control sub-circuit, a voltage from the output terminal of the compensation sub-circuit to the common voltage terminal if compensation is required.

* * * * *